(12) United States Patent
Xiao et al.

(10) Patent No.: US 11,735,581 B2
(45) Date of Patent: Aug. 22, 2023

(54) ELECTROSTATIC PROTECTION STRUCTURE COMPRISING ELECTROSTATIC PROTECTION UNITS CONTAINING TFT'S, TFT SUBSTRATE, AND DISPLAY PANEL

(71) Applicant: Century Technology (Shenzhen) Corporation Limited, Shenzhen (CN)

(72) Inventors: Sheng Xiao, Shenzhen (CN); Qi Xu, Shenzhen (CN); Tao Wang, Shenzhen (CN); Ya-Ke Zhang, Shenzhen (CN); Chih-Chung Liu, New Taipei (TW); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 17/158,313

(22) Filed: Jan. 26, 2021

(65) Prior Publication Data

US 2022/0052036 A1 Feb. 17, 2022

(30) Foreign Application Priority Data

Aug. 17, 2020 (CN) .......................... 202010827170.2

(51) Int. Cl.
*H01L 27/02* (2006.01)
*G02F 1/1368* (2006.01)
*G02F 1/1362* (2006.01)
*G02F 1/1335* (2006.01)
*H01L 27/15* (2006.01)
(Continued)

(52) U.S. Cl.
CPC ........ *H01L 27/0274* (2013.01); *G02F 1/1368* (2013.01); *G02F 1/133514* (2013.01); *G02F 1/136204* (2013.01); *G02F 1/136286* (2013.01); *H01L 27/0296* (2013.01); *H01L 27/156* (2013.01); *H10K 59/126* (2023.02); *H10K 59/131* (2023.02)

(58) Field of Classification Search
CPC ..................... G02F 1/136204; G02F 1/136286
See application file for complete search history.

(56) References Cited

U.S. PATENT DOCUMENTS

2003/0020845 A1* 1/2003 Lee .................... G02F 1/136204
349/40
2005/0270454 A1* 12/2005 Ahn .................. G02F 1/133555
349/114
(Continued)

FOREIGN PATENT DOCUMENTS

CN 2018-21189406 * 2/2019 ............... G09G 3/20

*Primary Examiner* — Lauren Nguyen
(74) *Attorney, Agent, or Firm* — ScienBiziP, P.C.

(57) ABSTRACT

An electrostatic protection structure able to discharge static electricity of either polarity from a functional circuit including signal lines includes a discharge electrode and a plurality of electrostatic protection units electrically coupled to the discharge electrode. Each electrostatic protection unit includes a first TFT and a second TFT. The first TFT includes first gate, source, and drain, the second TFT includes second gate, source, and drain. The first gate and the first drain are electrically connected to one signal line. The first source is electrically connected to the second drain, the first drain is electrically connected to the second source, the second gate is electrically connected to the discharge electrode, and the second gate is electrically connected to the second drain.

18 Claims, 9 Drawing Sheets

(51) Int. Cl.
*H10K 59/126* (2023.01)
*H10K 59/131* (2023.01)

(56) References Cited

U.S. PATENT DOCUMENTS

2006/0279667 A1\* 12/2006 Tsai .................... G02F 1/13454
349/40
2017/0104051 A1\* 4/2017 Gai ..................... H01L 27/1214
2020/0194425 A1\* 6/2020 Long .................... H01L 29/786

\* cited by examiner

ELECTROSTATIC PROTECTION STRUCTURE COMPRISING ELECTROSTATIC PROTECTION UNITS CONTAINING TFT'S, TFT SUBSTRATE, AND DISPLAY PANEL

FIELD

The subject matter herein generally relates to an electrostatic protection, structure, a TFT (TFT) substrate, and a display panel having the electrostatic protection structure.

BACKGROUND

Static electricity is common in nature. When two objects having different dielectric constants rub against each other, electrostatic may be generated. When an object with electrostatic charge is relieved and returns to a neutral state, this is called Electrostatic Discharge (ESD).

In the display panel, an electrostatic protection structure is required to guide electrostatic charges in the display panel to the outside to prevent instantaneous discharge of current from damaging the TFT elements in the pixel matrix area.

BRIEF DESCRIPTION OF THE DRAWINGS

Implementations of the present technology will now be described, by way of embodiments only, with reference to the attached figures.

DETAILED DESCRIPTION

Figure 1:
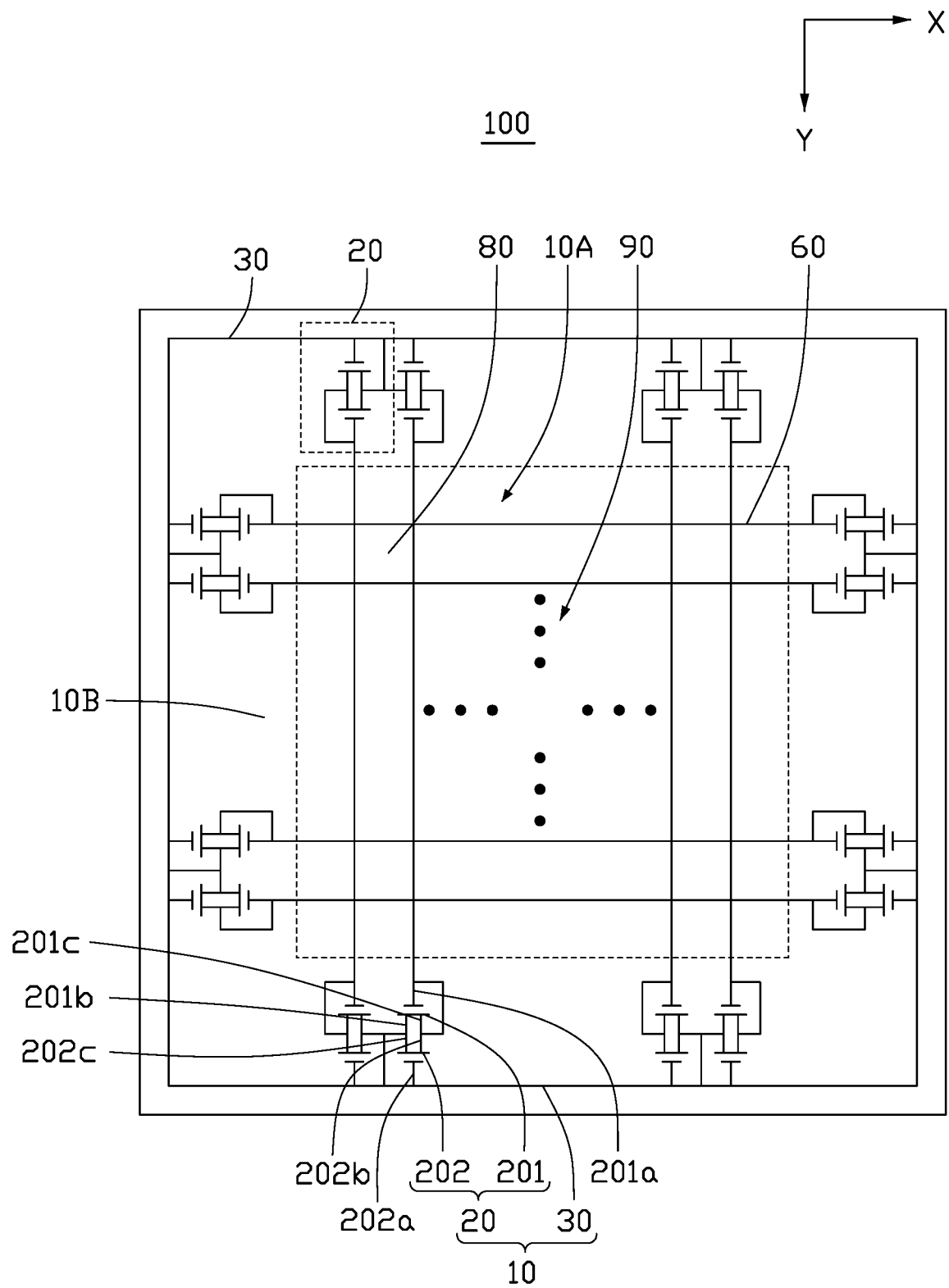
FIG. 1 is a schematic view of a TFT substrate according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

As shown in FIG. 1, a thin film transistor (TFT) substrate 100 of an embodiment of the present disclosure includes a display area 10A (the area surrounded by a dashed frame in FIG. 1) and a non-display area 10B around the display area 10A. An electrostatic protection structure 10 is provided in the non-display area 10B of the TFT substrate 100. The electrostatic protection structure 10 includes a discharge electrode 30 and a plurality of electrostatic protection units 20 electrically connected to the discharge electrode 30. In this embodiment, the discharge electrode 30 extends around the display area 10A in form of an enclosed pattern. A plurality of signal lines 60 is distributed on the TFT substrate 100 in both a X direction and a Y direction. The X direction intersects with the Y direction. In this embodiment, the X direction is perpendicular to the Y direction. Each electrostatic protection unit 20 is electrically connected to one signal line 60.

In this embodiment, each electrostatic protection unit 20 includes a first TFT 201 and a second TFT 202. The first TFT 201 includes a first gate 201a, a first source 201b, and a first drain 201c. The second TFT 202 includes a second gate 202a, a second source 202b, and a second drain 202c. In each electrostatic protection unit 20, the first drain 201c is electrically connected to the first gate 201a, and both the first drain 201c and the first gate 201a are electrically connected to the signal line 60. The first source 201b is electrically connected to the second drain 202c, the first drain 201c is electrically connected to the second source 202b, the second gate 202a is electrically connected to the discharge electrode 30, and the second gate 202a is electrically connected to the second drain 202c. In this embodiment, the second gate 202a of each electrostatic protection unit 20 is a part of the discharge electrode 30.

The discharge electrode 30 is electrically connected to a ground signal, and the electrostatic charges on the signal line 60 can be guided to the discharge electrode 30 by the electrostatic protection unit 20, and then be discharged by the discharge electrode 30 being grounded.

In this embodiment, the second gates 202a of all the electrostatic protection units 20 also form a part of the discharge electrode 30. Specifically, the second gates 202a of all the electrostatic protection units 20 are formed by patterning one metal layer, and the second gates 202a of all the electrostatic protection units 20 are electrically connected to function as part of the discharge electrode 30.

In this embodiment, the first TFT 201 and the second TFT 202 of each electrostatic protection unit 20 are both N-type TFTs or P-type TFTs. In this embodiment, positive or negative charges on the signal line 60 is discharged to the discharge electrode 30 by the first TFT 201 and the second TFT 202.

In this embodiment, each signal line 60 has opposite ends, and each end of each signal line 60 is electrically connected to one electrostatic protection unit 20, so that the electrostatic protection capability can be enhanced.

As shown in FIG. 1, in the display area 10A, an area defined by adjacent two signal lines 60 in the X direction and adjacent two signal lines 60 in the Y direction is defined as a pixel unit 80 of the TFT substrate 100. The signal lines 60 in the X direction and in the Y direction define a plurality of pixel units 80, and the pixel units 80 form a pixel matrix 90. In this embodiment, the discharge electrode 30 extends around the pixel matrix 90.

Figure 2:
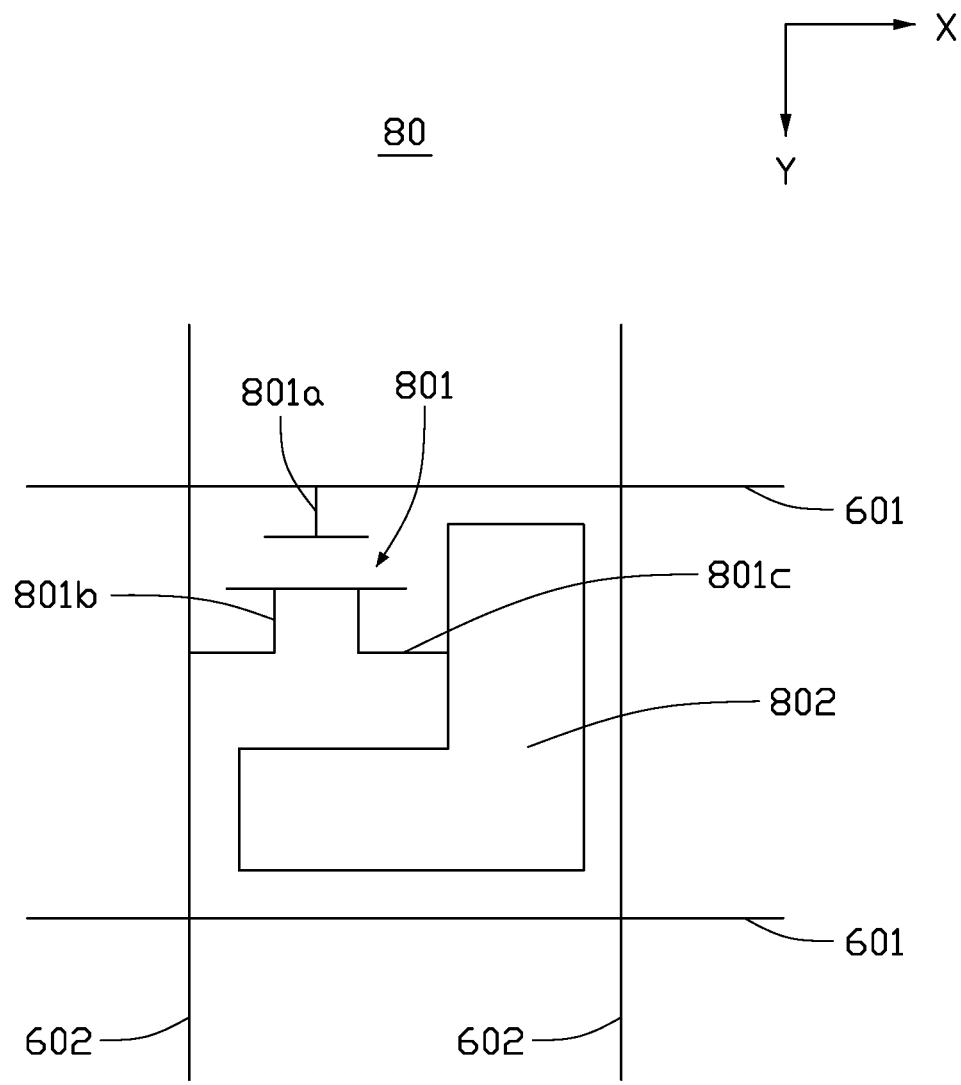
FIG. 2 is a schematic view of a pixel unit of the TFT substrate of FIG. 1.

As shown in FIG. 2, a third TFT 801 and a pixel electrode 802 electrically connected to the third TFT 801 are provided in each pixel unit 80 of the TFT substrate 100.

In this embodiment, the third TFT 801 includes a gate 801*a*, a source 801*b*, and a drain 801*c*. In this embodiment, each signal line 60 in the X direction is a gate scanning line 601 electrically connected to the gate 801*a* of the third TFT 801. Each signal line 60 in the Y direction is a source signal line 602 electrically connected to the source 801*b* of the third TFT 801. The pixel electrode 802 is electrically connected to the drain 801*c* of the third TFT 801. The electrostatic protection unit 20 electrically connected to the gate scanning line 601 and the source signal line 602 guides electrostatic charges in the pixel units 80 to the outside of the pixel matrix 90, which prevents electrostatic discharge current from instantaneously damaging the third TFT 801 in the pixel matrix 90.

Figure 3:
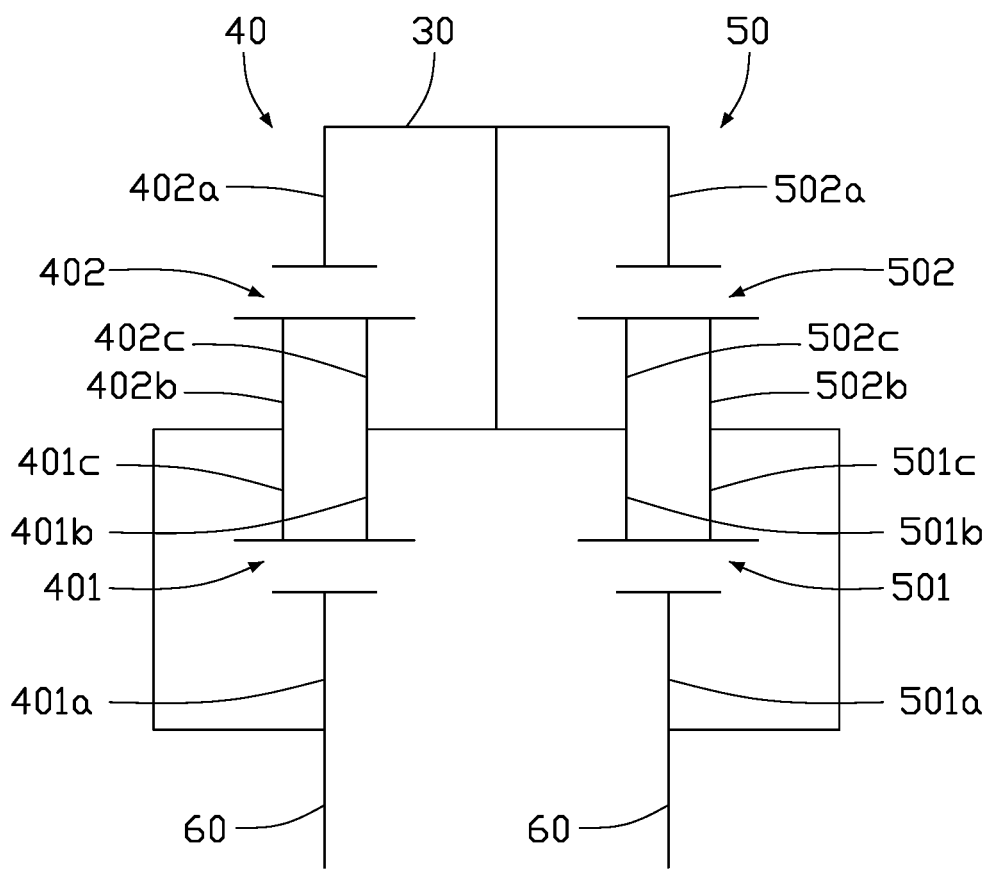
FIG. 3 is a circuit diagram of adjacent electrostatic protection units of the TFT substrate.

FIG. 3 shows that any adjacent electrostatic protection units 40 and 50 on the TFT substrate 100 are electrically connected. The electrostatic protection units 40 and the electrostatic protection unit 50 are electrically connected to one of two adjacent signal lines 60 respectively. The electrostatic protection unit 20, the electrostatic protection unit 40, and the electrostatic protection unit 50 are the same on the TFT substrate 100.

As shown in FIG. 3, the electrostatic protection unit 40 includes a first TFT 401 and a second TFT 402. The first TFT 401 includes a first gate 401*a*, a first source 401*b*, and a first drain 401*c*. The second TFT 402 includes a second gate 402*a*, a second source 402*b*, and a second drain 402*c*. The first drain 401*c* and the first gate 401*a* are electrically connected to each other and are electrically connected to the signal line 60. The first source 401*b* and the second drain 402*c* are electrically connected to each other. The first drain 401*c* and the second source 402*b* are electrically connected to each other. The second gate 402*a* is electrically connected to the discharge electrode 30, and the second gate 402*a* is electrically connected to the second drain 402*c*.

As shown in FIG. 3, the electrostatic protection unit 50 includes a first TFT 501 and a second TFT 502. The first TFT 501 includes a first gate 501*a*, a first source 501*b*, and a first drain 501*c*. The second TFT 502 includes a second gate 502*a*, a second source 502*b*, and a second drain 502*c*. The first drain 501*c* and the first gate 501*a* are electrically connected to each other and are electrically connected to the signal line 60. The first source 501*b* is electrically connected to the second drain 502*c*. The first drain 501*c* is electrically connected to the second source 502*b*. The second gate 502*a* is electrically connected to the discharge electrode 30. The second drain 402*c* is electrically connected to the second drain 502*c*.

In this embodiment, the second gate 402*a* and the second gate 502*a* are formed by patterning one metal layer and are electrically connected to form a part of the discharge electrode 30. The second gate 402*a* and the second gate 502*a* are reused as a part of the discharge electrode 30.

Figure 5:
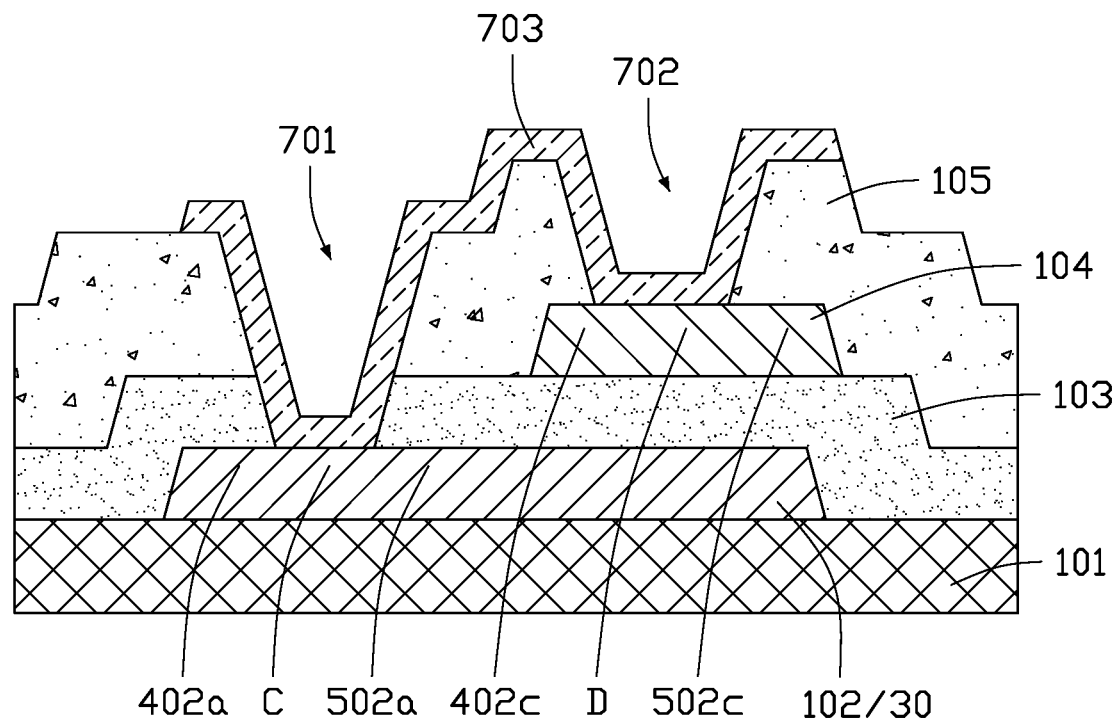
FIG. 5 is a cross-sectional view along a line $I_1$-$I_2$ in FIG. 4.
Figure 6:
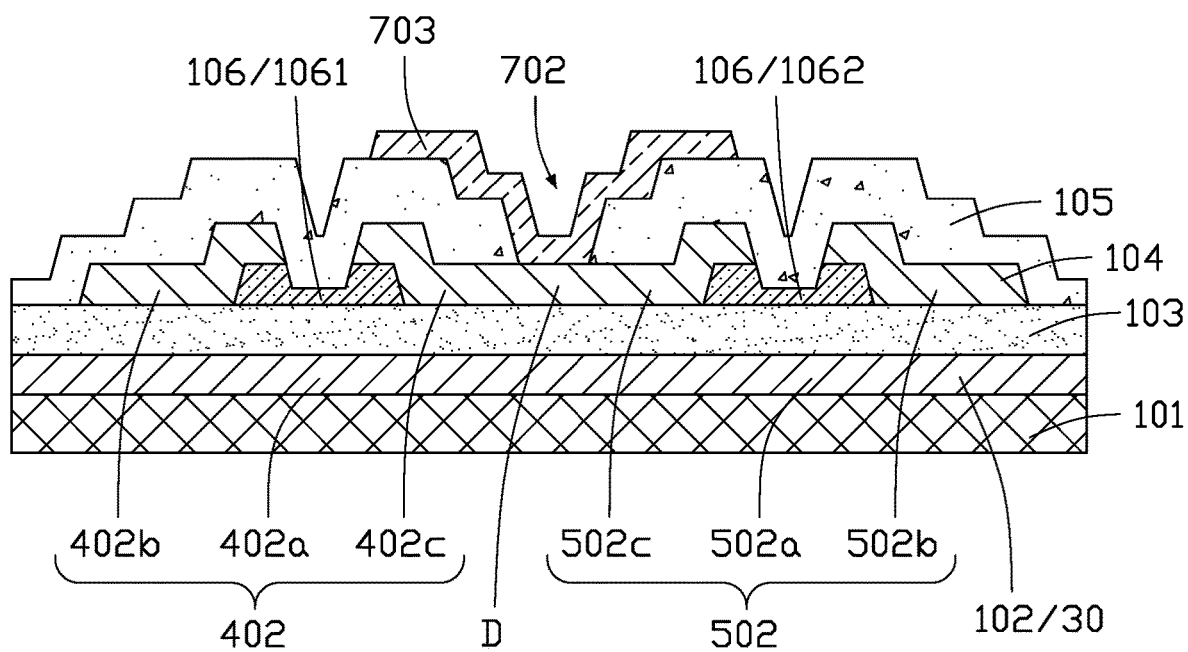
FIG. 6 is a cross-sectional view along a line $I_3$-$I_4$ in FIG. 4.

Referring to FIG. 5 and FIG. 6, the TFT substrate 100 includes a substrate 101, and the electrostatic protection structure 10 is located on the substrate 101. The TFT substrate 100 further includes a patterned first metal layer 102 on the substrate 101, a first insulating layer 103 on the substrate 101 and covering the first metal layer 102, a patterned semiconductor layer 106 on the first insulating layer 103, and a patterned second metal layer 104 on the first insulating layer 103 and covering the semiconductor layer 106. The semiconductor layer 106 is partially exposed from the second metal layer 104. The TFT substrate 100 further includes a second insulating layer 105 covering both the second metal layer 104 and the semiconductor layer 106. In this embodiment, the semiconductor layer 106 includes the semiconductor layer 1061 of the second TFT 402 and the semiconductor layer 1062 of the second TFT 502.

As shown in FIG. 5 and FIG. 6, the second gate 402*a* the second gate 502*a* are electrically connected to each other, being formed by the patterned first metal layer 102, and both forming a part of the discharge electrode. The second source 402*b*, the second drain 402*c*, the second source 502*b*, and the second drain 502*c* are all formed by the patterned second metal layer 104. The second gate 402*a* aligns with the semiconductor layer 1061. The second source 402*b* and the second drain 402*c* are located on opposite sides of the semiconductor layer 1061 and spaced apart from each other. The second gate 502*a* aligns with the semiconductor layer 1062. The second source 502*b* and the second drain 502*c* are located on opposite sides of the semiconductor layer 1062 and spaced apart from each other. The second drain 402*c* is electrically connected to the second drain 502*c*.

In this embodiment, the gate 801*a* of the third TFT 801 in the display area 10A is also formed by the patterned first metal layer 102, and the source 801*b* and drain 801*c* of the third TFT 801 are formed by the patterned first metal layer 102. The semiconductor layer 106 also includes the semiconductor layer (not shown) of the third TFT 801.

As shown in FIG. 5 and FIG. 6, the TFT substrate 100 further includes a conductive layer 703. The first insulating layer 103 and the second insulating layer 105 defines a first opening 701. The first opening 701 exposes an electrical connection position C of the second gate 402*a* and the second gate 502*a*. The second insulating layer 105 defines a second opening 702. The second opening 702 exposes an electrical connection position D of the second drain 402*c* and the second drain 502*c*. The conductive layer 703 is formed on the second insulating layer 105 and extends into the first opening 701 and the second opening 702. The first opening 701, the second opening 702, and the conductive layer 703 form a bridge structure 70. In this embodiment, the second gate 402*a* and the second drain 402*c* of the second TFT 402 are electrically connected by the bridge structure 70, and the second gate 502*a* and the second drain 502*c* of the second TFT 502 are electrically connected by the bridge structure 70.

Figure 4:
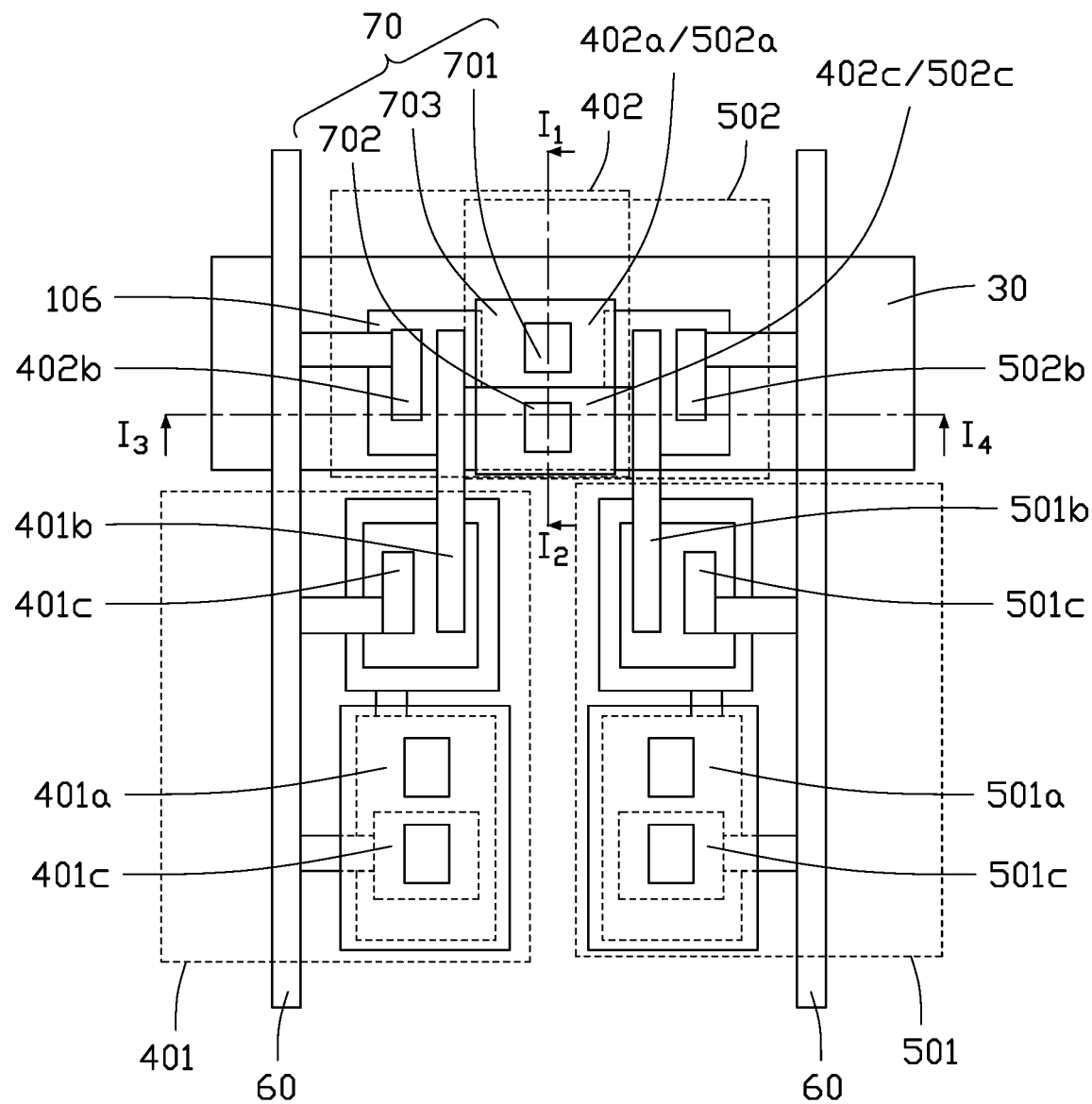
FIG. 4 is a top view of part of adjacent electrostatic protection units of FIG. 3 on the TFT substrate.

In a conventional TFT substrate, the gates and drains of TFTs located at different layers need to be electrically connected by bridge structures. When each TFT uses a bridge structure for electrical connection, it will inevitably occupy more panel space. As shown in FIG. 4, the second TFT 402 and the second TFT 502 share one bridge structure 70 to electrically connect the gate and the drain. In this way, the two adjacent electrostatic protection units 40 and electrostatic protection unit 50 share the bridging structure 70 so that space occupied by the electrostatic protection structure 10 can be reduced, which is conducive to narrow frame area of the panel.

In this embodiment, the second gates 202*a* of all the electrostatic protection units 20 are formed by the patterned first metal layer 102 and jointly form a part of the discharge electrode 30. The signal lines 60 are located on the substrate 101 and may be formed by the patterned second metal layer 104.

Figure 7:
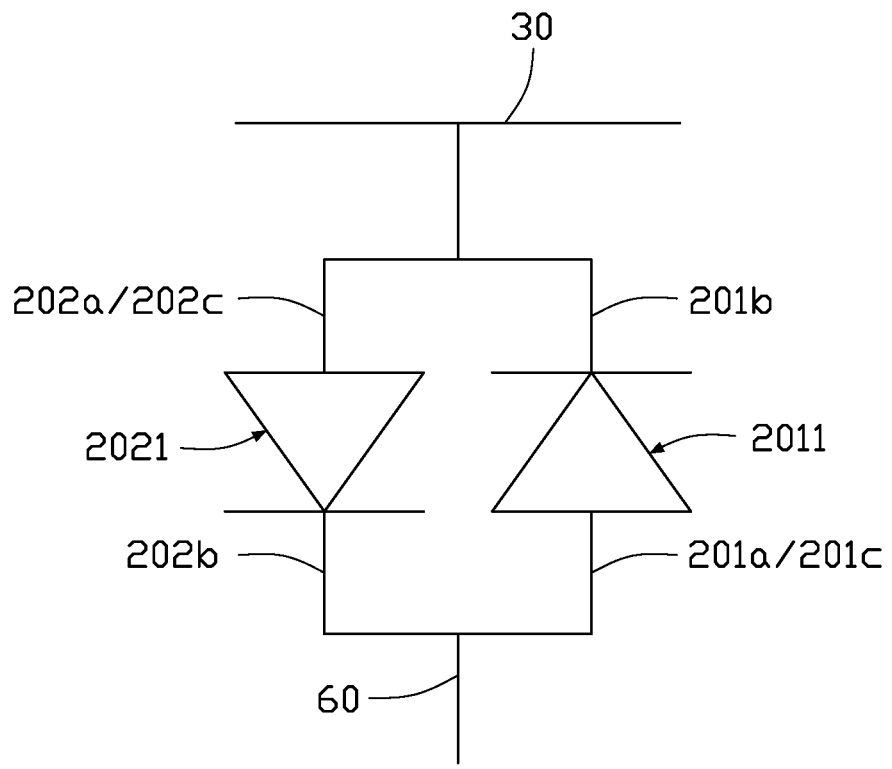
FIG. 7 is a circuit diagram of one electrostatic protection unit or equivalent in FIG. 1.

FIG. 7 is an equivalent circuit diagram of each electrostatic protection unit 20 in FIG. 1. When both the first TFT 201 and the second TFT 202 are N-type transistors, the first TFT 201 is equivalent to a diode 2011, and the second TFT 202 is equivalent to a diode 2021. Specifically, the first gate 201a and the first drain 201c electrically connected are equivalent to an anode of the diode 2011, and the first source 201b is equivalent to a cathode of the diode 2011. The second gate 202a and the second drain 202c electrically connected are equivalent to an anode of the diode 2021, and the second source 202b is equivalent to a cathode of the diode 2021.

As shown in FIG. 7, the cathode of the diode 2011 and the anode of the diode 2021 are both electrically connected to the discharge electrode 30. The anode of the diode 2011 and the cathode of the diode 2021 are both electrically connected to the signal line 60. In this embodiment, electrostatic charges on the signal line 60 is discharged to the discharge electrode 30 by the diode 2011 and the diode 2021. Specifically, any positive charge on the signal line 60 is discharged to the discharge electrode 30 by the diode 2011, and any negative charge on the signal line 60 is discharged to the discharge electrode 30 by the diode 2021.

In other embodiments, both the first TFT 201 and the second TFT 202 can be P-type transistors. The first gate 201a and the first drain 201c electrically connected are equivalent to a cathode of the diode 2011, and the first source 201b is equivalent to an anode of the diode 2011. The second gate 202a and the second drain 202c are equivalent to a cathode of the diode 2021, and the second source 202b is equivalent to an anode of the diode 2021. Both the anode of the diode 2011 and the cathode of the diode 2021 are electrically connected to the discharge electrode 30 and the cathode of the diode 2011 and the anode of the diode 2021 are both electrically connected to the signal line 60.

It can be understood that the above-mentioned electrostatic protection structure 10 can also be used to discharge static electricity of other functional circuits having signal lines 60, and is not limited to the switching circuit in the TFT substrate 100. "Functional circuit" refers to a circuit having functions other than the electrostatic discharge function.

Figure 8:
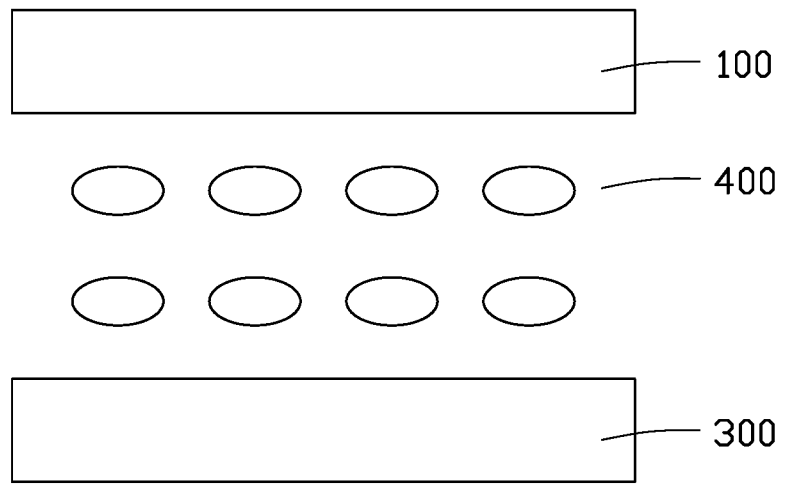
FIG. 8 is a cross-sectional view of a display panel according to a first embodiment of the disclosure.

The present disclosure also provides a display panel 200. As shown in FIG. 8, the display panel 200 is a liquid crystal display panel and includes the TFT substrate 100, a color filter substrate 300 opposite to the TFT substrate 100, and a liquid crystal layer 400 between the TFT substrate 100 and the color filter substrate 300. The display panel 200 further includes the electrostatic protection structure 10 on the TFT substrate 100 for electrostatic protection of the display panel 200.

Figure 9:
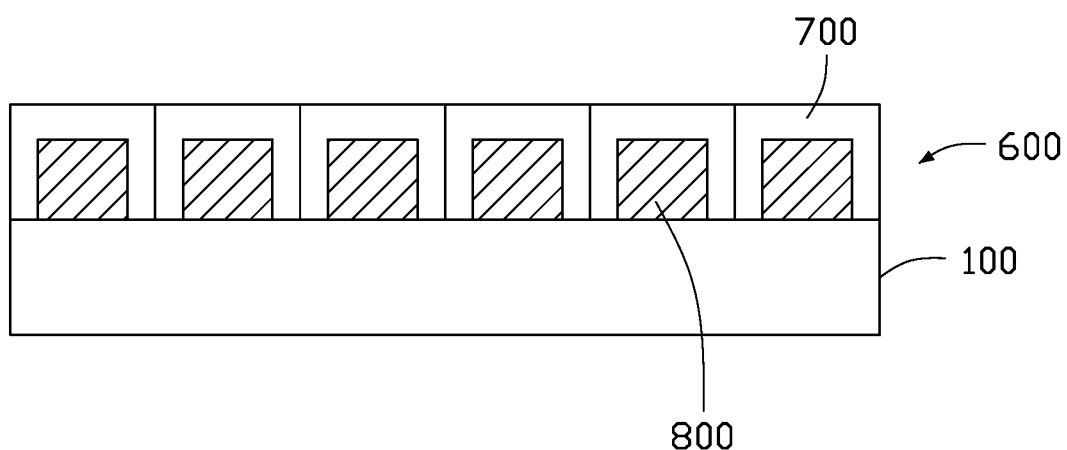
FIG. 9 is a cross-sectional view of a display panel according to a second embodiment of the present disclosure.

As shown in FIG. 9, the present disclosure also provides another display panel 500. The display panel 500 includes the TFT substrate 100 and a light-emitting element array 600. The light-emitting element array 600 includes a plurality of light-emitting units 700, and each light-emitting unit 700 includes a light-emitting element 800. The TFT substrate 100 is used to drive the light-emitting elements 800 of the light-emitting element array 600 to emit light to display images. The display panel 500 further includes the electrostatic protection structure 10 on the TFT substrate 100 for electrostatic protection of the display panel 500.

In this embodiment, the light-emitting element array 600 is an organic light-emitting diode (OLED) array, a Micro-light-emitting diodes (LED) array, or a Mini-LED array.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An electrostatic protection structure configured to discharge static electricity of a function circuit comprising a plurality of signal lines, the electrostatic protection structure comprising:
    a discharge electrode;
    a plurality of electrostatic protection units electrically coupled to the discharge electrode,
    wherein each of the plurality of electrostatic protection units comprises a first thin film transistor (TFT) and a second TFT; the first TFT comprises a first gate, a first source, and a first drain; the second TFT comprises a second gate, a second source, and a second drain; the first gate and the first drain are electrically connected to each other and both electrically connected to one of the plurality of signal lines; the first source is directly electrically connected to the second drain; the first drain is directly electrically connected to the second source; the second gate is electrically connected to the discharge electrode, and the second gate is electrically connected to the second drain;
    the second drains of two adjacent of the plurality of electrostatic protection units are directly electrically connected to each other, and the second gates and the second drains of the two adjacent static electricity protection units are electrically connected by sharing a bridge structure; and
    the second gate of each of the plurality of electrostatic protection units is a part of the discharge electrode.

2. The electrostatic protection structure of claim 1, wherein both the first TFT and the second TFT are N-type TFTs or P-type TFTs.

3. A thin film transistor (TFT) substrate defining a display area and a non-display area surrounding the display area, the TFT substrate comprising:
    a substrate;
    a plurality of signal lines on the substrate; and
    an electrostatic protection structure on the substrate and in the non-display area, the electrostatic protection structure comprising:
        a discharge electrode; and
        a plurality of electrostatic protection units electrically coupled to the discharge electrode;
    wherein each of the plurality of electrostatic protection units comprises a first TFT and a second TFT; the first TFT comprises a first gate, a first source, and a first drain; the second TFT comprises a second gate, a second source, and a second drain; the first gate and the first drain are electrically connected to each other and both electrically connected to one of the plurality of signal lines; the first source is directly electrically connected to the second drain; the first drain is directly electrically connected to the second source; the second gate is electrically connected to the discharge electrode, and the second gate is electrically connected to the second drain;
    the second drains of two adjacent of the plurality of electrostatic protection units are directly electrically connected to each other, and the second gates and the second drains of the two adjacent static electricity protection units are electrically connected by sharing a bridge structure; and the second gate of each of the plurality of electrostatic protection units is a part of the discharge electrode.

4. The TFT substrate of claim 3, wherein the discharge electrode locates in the non-display area and extends around the display area to be an enclosed pattern.

5. The TFT substrate of claim 3, wherein each of the plurality of signal lines comprises opposite ends, each of the opposite ends is electrically coupled to one of the plurality of electrostatic protection units.

6. The TFT substrate of claim 4, wherein a portion of the plurality of signal lines extends in a X direction, and other of the plurality of signal lines extends in a Y direction intersecting with the X direction, a pixel unit is defined by two adjacent signal lines extending in the X direction and two adjacent signal lines extending in the Y direction; a third TFT and a pixel electrode are formed in the pixel unit; the signal lines extending in the X direction are gate scanning lines; and the signal lines extending in the Y direction are source signal lines.

7. The TFT substrate of claim 3, further comprising a first metal layer on the substrate, a first insulating layer on the substrate, a second metal layer on the first insulating layer, and a second insulating layer on the first insulating layer and covering the second metal layer, wherein the second gate of each of the plurality of electrostatic protection units and the discharge electrode are formed by the first metal layer; and the second drain of each of the plurality of electrostatic protection units and the plurality of signal lines are formed by the second metal layer.

8. The TFT substrate of claim 7, further comprising a conductive layer, wherein the first insulating layer and the second insulating layer defines a first opening; the second insulating layer defines a second opening; and the conductive layer is formed on the second insulating layer and extends into the first opening and the second opening to form the bridge structure.

9. The TFT substrate of claim 3, wherein both the first TFT and the second TFT are N-type TFTs or P-type TFTs.

10. A display panel, comprising:
a color filter substrate;
the TFT substrate of claim 3, and
a liquid crystal layer between the TFT substrate and the color filter substrate.

11. A display panel, comprising:
the TFT substrate of claim 3, and
a light-emitting element array on the TFT substrate, the light-emitting element array comprising a plurality of light-emitting units.

12. The electrostatic protection structure of claim 1, wherein the first gates of the two adjacent of the plurality of electrostatic protection units are electrically connected to different ones of the plurality of signal lines.

13. The electrostatic protection structure of claim 1, wherein the second gates of each of the plurality of electrostatic protection units and the discharge electrode are formed by a same first metal layer.

14. The electrostatic protection structure of claim 1, wherein the second drain of each of the plurality of electrostatic protection units and the plurality of signal lines are formed by a same second metal layer.

15. The electrostatic protection structure of claim 14, further comprising a second insulating layer on the second metal layer and a conductive layer on the second insulating layer, wherein the second insulating layer defines a second opening exposing an electrical connection position of the second drains of the two adjacent static electricity protection units, and the conductive layer extends into the second opening directly contacts and electrically connects the second drains of the two adjacent static electricity protection units.

16. The TFT substrate of claim 3, wherein the first gates of the two adjacent of the plurality of electrostatic protection units are electrically connected to different ones of the plurality of signal lines.

17. The display panel of claim 10, wherein the first gates of the two adjacent of the plurality of electrostatic protection units are electrically connected to different ones of the plurality of signal lines.

18. The display panel of claim 11, wherein the first gates of the two adjacent of the plurality of electrostatic protection units are electrically connected to different ones of the plurality of signal lines.

* * * * *

UNITED STATES PATENT AND TRADEMARK OFFICE
CERTIFICATE OF CORRECTION

PATENT NO. : 11,735,581 B2
APPLICATION NO. : 17/158313
DATED : August 22, 2023
INVENTOR(S) : Sheng Xiao et al.

Page 1 of 1

It is certified that error appears in the above-identified patent and that said Letters Patent is hereby corrected as shown below:

On the Title Page

Item (54) and in the Specification, Column 1 Lines 1-5, should read:
ELECTROSTATIC PROTECTION STRUCTURE COMPRISING ELECTROSTATIC
PROTECTION UNITS CONTAINING TFTS, TFT SUBSTRATE, AND DISPLAY PANEL Signed and Sealed this
Nineteenth Day of December, 2023

Katherine Kelly Vidal
*Director of the United States Patent and Trademark Office*